United States Patent
Shieh et al.

(10) Patent No.: US 8,154,007 B2
(45) Date of Patent: Apr. 10, 2012

(54) SILICON-QUANTUM-DOT SEMICONDUCTOR NEAR-INFRARED PHOTODETECTOR

(75) Inventors: Jia-Min Shieh, Hsinchu (TW); Wen-Chein Yu, Hsinchu (TW); Chao-Kei Wang, Hsinchu (TW); Bau-Tong Dai, Hsinchu (TW); Ci-Ling Pan, Hsinchu (TW); Hao-Chung Kuo, Hsinchu (TW); Jung-Y. Huang, Hsinchu (TW)

(73) Assignee: National Applied Research Laboratories, Hsinchu (TW)

( * ) Notice: Subject to any disclaimer, the term of this patent is extended or adjusted under 35 U.S.C. 154(b) by 249 days.

(21) Appl. No.: 12/702,451

(22) Filed: Feb. 9, 2010

(65) Prior Publication Data

US 2010/0213440 A1   Aug. 26, 2010

(51) Int. Cl.
*H01L 29/06* (2006.01)

(52) U.S. Cl. ....... 257/12; 257/20; 257/21; 257/E31.053; 257/E33.076; 977/774; 977/932; 977/962

(58) Field of Classification Search .............. 257/20, 257/E31.053, 21, 12, E33.076; 977/774, 977/932, 962
See application file for complete search history.

(56) References Cited

U.S. PATENT DOCUMENTS

| 6,118,686 | A  * | 9/2000 | Taira et al. ............. 365/129 |
| 6,661,022 | B2 * | 12/2003 | Morie et al. ............. 257/14 |
| 2005/0003620 | A1* | 1/2005 | Ko ............. 438/297 |
| 2005/0037631 | A1* | 2/2005 | Koh ............. 438/962 |
| 2006/0067602 | A1* | 3/2006 | Todori et al. ............. 385/8 |
| 2007/0108502 | A1* | 5/2007 | Li et al. ............. 257/316 |
| 2009/0184346 | A1* | 7/2009 | Jain ............. 257/288 |

* cited by examiner

*Primary Examiner* — Fernando L Toledo
*Assistant Examiner* — Ankush Singal
(74) *Attorney, Agent, or Firm* — Jackson IPG PLLC; Demian K. Jackson

(57) ABSTRACT

A mesoporous silica having adjustable pores is obtained to form a template and thus a three-terminal metal-oxide-semiconductor field-effect transistor (MOSFET) photodetector is obtained. A gate dielectric of a nano-structural silicon-base membrane is used as infrared light absorber in it. Thus, a semiconductor photodetector made of pure silicon having a quantum-dot structure is obtained with excellent near-infrared optoelectronic response.

7 Claims, 9 Drawing Sheets

SILICON-QUANTUM-DOT SEMICONDUCTOR NEAR-INFRARED PHOTODETECTOR

FIELD OF THE INVENTION

The present disclosure relates to a photodetector; more particularly, relates to obtaining a semiconductor photodetector made of pure silicon having a quantum-dot structure with excellent near-infrared optoelectronic response.

DESCRIPTION OF THE RELATED ARTS

Silicon is a most abundant element in earth. Silicon semiconductor industry has also been developed into a huge, integrated and independent technology field. Hence, silicon-base material is used in non-traditional field, like optoelectronic applications. An example is porous silicon; another example is silicon nanocrystal embedded or covered with $SiO_{x<2.0}$ film and amorphous silicon (a-Si:H); and still another example is silicon nano quantum dot. Among them, mesoporous silica is a conspicuous nano material which has a high porosity to 75%; a large surface area reaching about 1000 $m^2/g$; and pores having diameters between 2 and 10 nanometers (nm). Thus, with arranged nano-size pores, quantum dots and quantum wires are assembled. Then, their physical characteristics regarding optical and electric effects are researched for trying to find silicon-base nano-material to replace III-V group semiconductor material for saving resource and reducing cost.

Although interband characteristics of silicon nanostructure are widely researched, their intra-band characteristics are almost ignored. In recent years, quantum dot attracts peoples' attentions because its intra-band absorption happens within infrared band and is fit for infrared photodetector. In addition, a quantum dot infrared photodetector solves a major problem of a quantum well infrared photodetector. The problem is that the quantum well infrared photodetector is non-sensitive when being radiated by a normal incident light. Yet, researches on intra-band quantum transition are almost focused on III-V group systems, where, for a long time, a III-V group infrared photodetector has a problem in manufacture. The problem is that the silicon semiconductor manufacture may produce pollution and so cost high and is not fit for silicon semiconductor industries. Besides, quantum well, and silicon-germanium (Si—Ge) quantum dot for example, have to use precise lithography, etching or other manufacturing processes which are operated under high temperature and are time-spending. Yet, it is hard to go through all these complex manufacturing processes under good control for making high-density and three-dimensional distributed quantum dot.

A photodetector for near-infrared band between 1300 and 1500 nm is widely used for fire detection, pollution analysis, medicine utilities, astronomical observation, optical communication and even military uses, where a Si—Ge photodetector integrated with silicon integrated circuit is eye-catching. Accordingly, Stanford university announced a metal-oxide-semiconductor field-effect transistor (MOSFET) optoelectronic switch. Ge gate was used for near-infrared light absorption layer. Since Ge has an energy gap of 0.8 electron volts (eV), energy band may bend and electron-hole pairs may be produced when the Ge gate is photo-excited by 1.3 to 1.5 µm infrared light with an external voltage. Therein, positive charge is accumulated at a Ge—$SiO_2$ interface to draw electrons for enhancing switching-on between source and drain and enlarging photocurrent outputted at drain. Thus, an optical communication transistor photodetector is realized. But, Ge is expansive and has worse interface characteristics than Si or many other dielectric materials; and it is hard to obtain a transistor photodetector integrated with Ge. Although, in OPTICS LETTERS, 2001, a 1.55 µm infrared photodetector made of porous silicon is revealed, its photoresponse is only about 0.1 ampere per watt (A/W) and the photodetector is hard to be integrated in a device.

Infrared photodetector is maturely developed and its quantity demanded is big. It is widely used in medicine even in optical storage. Although silicon material is very successfully used in fabricating chips, it has 1.1 eV indirect bandgap and so is unsuitable for optoelectronic application. Although, nano-scale silicon may become a next-generation optoelectronic material owing to its bandgap related to its particle size, III-V group semiconductor is still a material most widely used for photodetectors, which has problems in fabricating infrared photodetectors and costs high. Hence, the prior arts do not fulfill all users' requests on actual use.

SUMMARY OF THE INVENTION

The main purpose of the present disclosure is to obtain a semiconductor photodetector made of pure silicon having a quantum-dot structure with excellent near-infrared optoelectronic response.

To achieve the above purpose, the present disclosure is a silicon-quantum-dot (Si-QD) semi-conductor near-infrared photodetector, comprising a substrate; an epi-like silicon layer being deposed on the substrate and respectively having a source on a part of area and a drain on another part of area; and a gate dielectric being deposed on the epi-like silicon layer and comprising two buffer layers and a Si-QD structure, where the gate dielectric has a gate deposed on it; the Si-QD structure is a Si-QD superlattice or a silicon nanocrystal/mesoporous silica formed by the mesoporous silica and arrays of high-density quantum dots; the Si-QD structure is clipped between the two buffer layers; the quantum dots are made of a nanocrystal of nanocrystalline silicon and are obtained on inner walls of the pores of the mesoporous silica; and the mesoporous silica having adjustable pores is obtained to form a nano-structural silicon-base membrane as the gate dielectric, which is used for the infrared light absorber and to produce a three-terminal nano-structural silicon-oxide gate transistor. Accordingly, a novel Si-QD semiconductor near-infrared photodetector is obtained.

BRIEF DESCRIPTION OF THE DRAWINGS

The present disclosure will be better understood from the following detailed descriptions of the preferred embodiments according to the present disclosure, taken in conjunction with the accompanying drawings, in which.

DESCRIPTION OF THE PREFERRED EMBODIMENT

The following descriptions of the preferred embodiments are provided to understand the features and the structures of the present disclosure.

Figure 1:
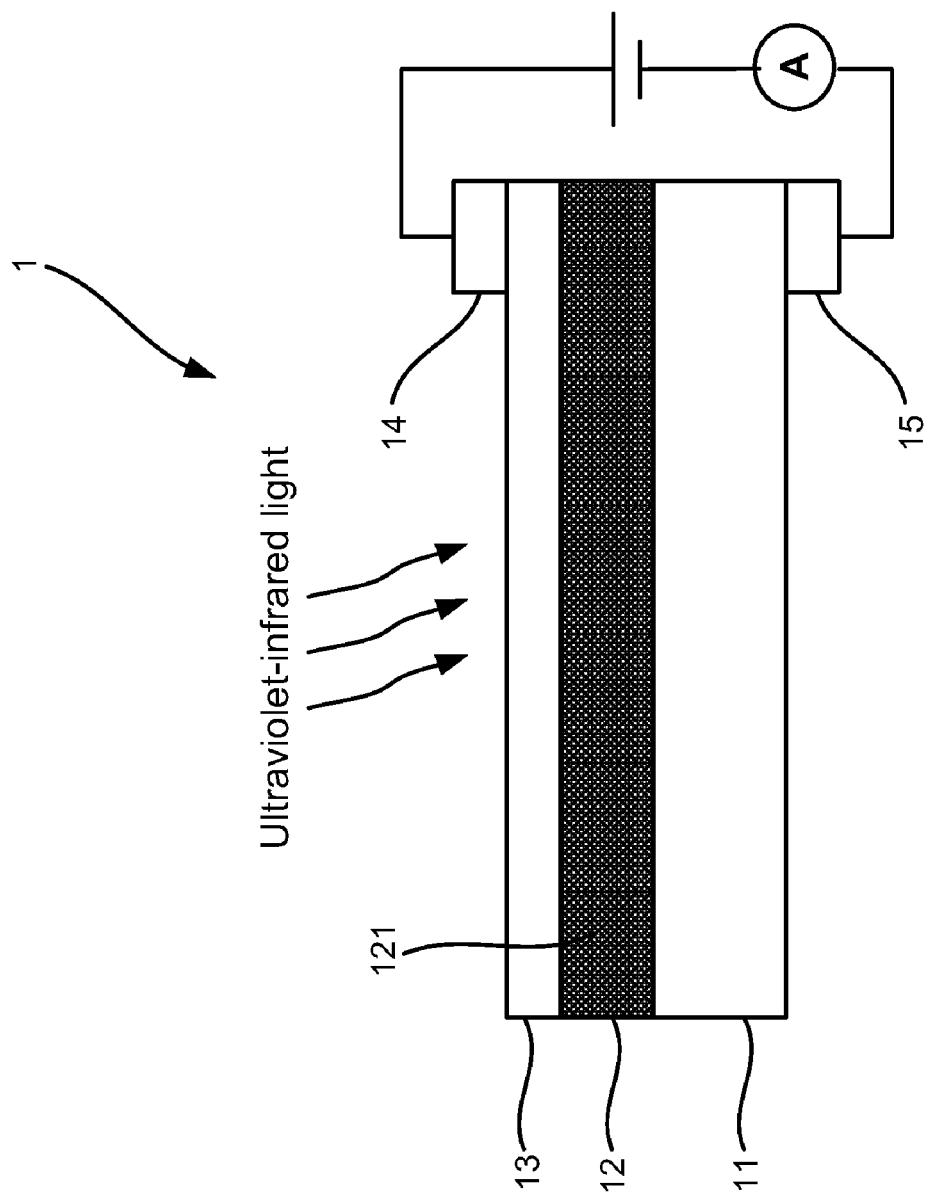
FIG. 1 is the sectional view showing the first preferred embodiment according to the present disclosure.
Figure 3:
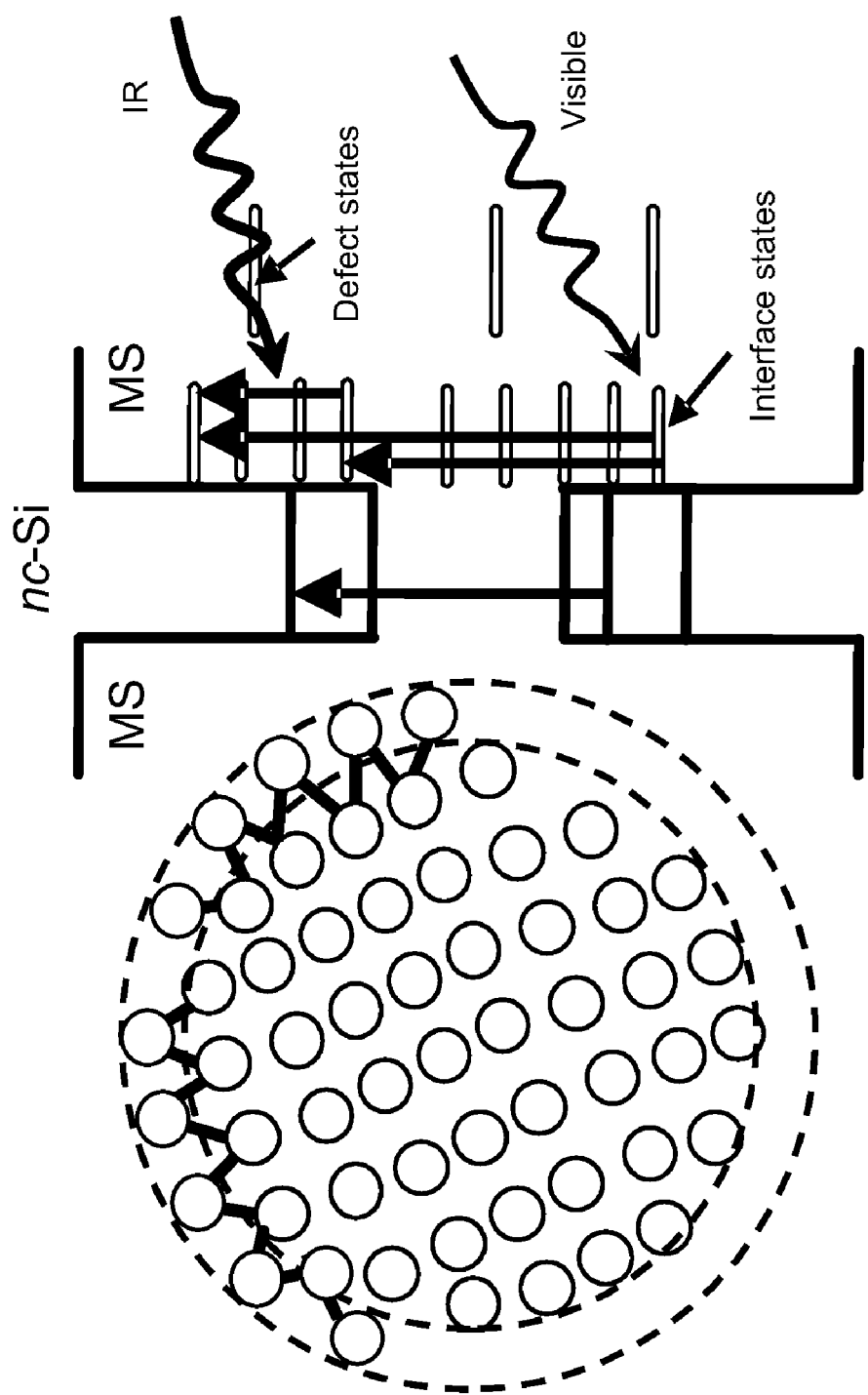
FIG. 3 is the view showing the energy levels of Si-QD embedded in the mesoporous silica.

Please refer to FIG. 1 until FIG. 3, which are a sectional view showing a first preferred embodiment according to the present disclosure; a view showing photoresponse spectrum for a wavelength ranged from ultraviolet (UV) to near-infrared; and a view showing energy levels of Si-QD embedded in mesoporous silica (MS). As shown in the figures, a first preferred embodiment according to the present disclosure is a two-terminal silicon-quantum-dot (Si-QD) metal-oxide-semiconductor (MOS) near-infrared photodetector. At first, a mesoporous silica having adjustable pores is used as a template. High-density Si-QD arrays are formed three-dimensionally below 400° C. within a few minutes on the mesoporous silica while coordinated with pulsed high-density Plasma Assistant Atomic Layer Chemical Vapor Deposition (PAALD). The quantum dots arrays have excellent Si-QD/MS interface and a lot of electric dipoles and surface states. Thus, very thin silica pore walls are obtained for passing carriers easily; and excellent photoresponse to near-infrared wavelength is obtained without using non-silicon material like germanium (Ge) or III-V group semiconductor.

Figure 2:
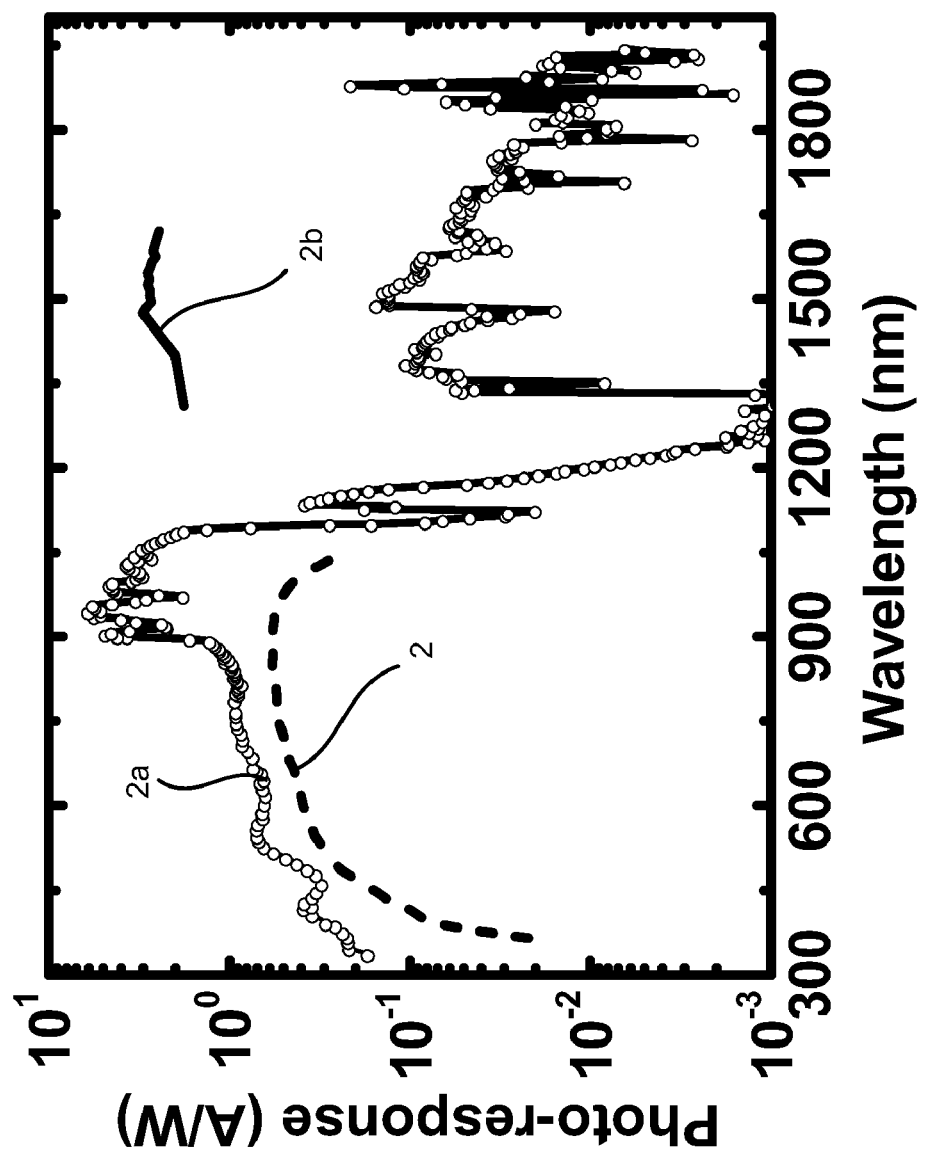
FIG. 2 is the view showing the photoresponse spectrum for a wavelength ranged from ultraviolet to near-infrared.

In FIG. 1, a material having a Si-QD/MS superlattice (SL) structure is used as a light absorber to obtain a two-terminal MOS photodetector. Mesoporous silica is used to obtain a template for fabricating a Si-QD MOS near-infrared photodetector 1. The near-infrared photodetector 1 comprises a silicon substrate 11; a Si-QD structure 12 on the silicon substrate 11, a Si-QD SL or a nc-Si/MS; and an indium tin oxide (ITO) layer 13, where electric junctions 14, 15 are separately obtained in surfaces of the p-type silicon substrate 11 and the ITO layer 13. In FIG. 2, TEM is used to analyze a sectional surface of the Si-QD structure 12, where the quantum dots have a size of 4 to 5 nanometers (nm) for each one; have a density of $2.5 \times 10^{18}/cm^3$; and are stacked three-dimensionally.

The Si-QD structure is used as a light absorber of a two- or three-terminal MOSFET photodetector for performing excellent near-infrared optoelectronic response. In FIG. 2, a reference curve 2 shows the photoresponse for a photodetector without silicon quantum dots. A photoresponse curve 2a of the present disclosure shows photoresponse between 320 and 1900 nm. A photoresponse curve 2a of a Si-QD MOS near-infrared photodetector at 420, 560 and 770 nm shows 0.4, 0.7 and 0.9 amperes per watt (A/W). The photodetector has an excellent photoelectric converting efficiency as high as 160% and a response time faster than 10 nano-seconds. Especially, obvious photoresponse is obtained between 900 and 1100 nm, where 6 A/W is shown at 940 nm and 0.2 A/W is also found between 1300 and 1500 nm. A photoresponse curve 2b of a three-terminal MOSFET photodetector shows excellent photoresponse at near-infrared spectrum. Thus, the present disclosure uses a nano-structural silicon-base membrane as a gate dielectric to induce a nugget effect of near-infrared excited quantum-effect intra-band transition and to obtain an outstanding absorption of an incident light for obvious photoresponse; and a near-infrared photodetector made of pure silicon is obtained. Because the quantum dot 121 has very small size, a quantum-effect intra-band transition for near-infrared light is obtained to break the limit of far-infrared light detection owing to large quantum dot. Hence, a three-terminal MOSFET photodetector according to the present disclosure has a photoresponse up to 2.8 A/W at 1550 nm, which is obviously better than 0.08 mA/W for Ge quantum-dot photodetector and is of great help to optical storage, optical communication and photovoltaic devices.

In addition, the Si-QD MOS near-infrared photodetector 1 also has excellent improved photoresponse illuminated under ultraviolet light. When the Si-QD MOS near-infrared photodetector 1 is operated under reverse bias, the silicon substrate 11 forms an inversion layer and the Si-QD structure 12 on the silicon substrate 11 captures positive charge to enhance the injection of carriers into upper electrode. At last, an effect of enlarging photo-excited current generated in the Si-QD structure 12 is obtained.

Figure 4:
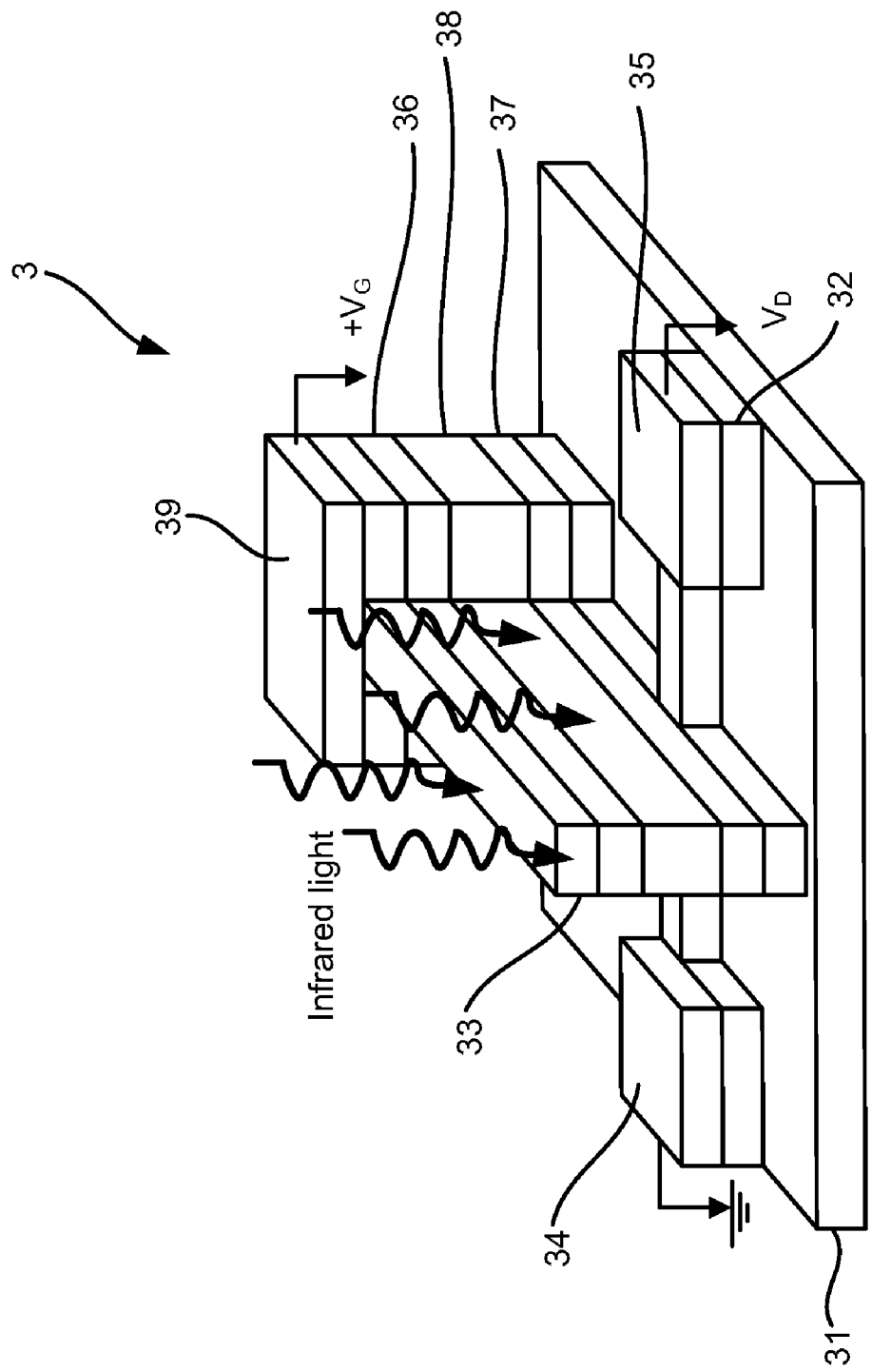
FIG. 4 is the perspective view showing the second preferred embodiment.

Please refer to FIG. 4, which is a perspective view showing a second preferred embodiment. As shown in the figures, a second embodiment of a Si-QD MOSFET near-infrared photodetector 3 according to the present disclosure has a silicon-base nano-structure as a light absorbing layer. The layer is a nano-structural silicon-base membrane of a gate dielectric having a quantum-effect intra-band transition as an infrared absorber for forming a three-terminal nano-structural silicon-oxide gate transistor (Metal-Oxide-Semiconductor Field-Effect Transistor, MOSFET). The near-infrared photodetector 3 has a 6 micrometers (μm) length with a 25 μm width, comprising a substrate 31 made of quartz; an epi-like silicon layer 32 on the substrate 31; and a gate 33 on the epi-like silicon layer 32. Therein, the epi-like silicon layer 32 has a source 34 on a part of area of the epi-like silicon layer 32 and a drain 35 on another part of area of the epi-like silicon layer 32, respectively; the gate 33 comprises two buffer layers 36, 37 and a Si-QD structure 38; the Si-QD structure 38 is clipped between the two buffer layers 36, 37; the gate 33 has an aluminum contact 39 on itself; the gate 33 is made of polycrystalline silicon; and contacts of the source 34 and the drain 35 are made of aluminum.

The Si-QD structure 38 is formed by mesoporous silica and arrays of high-density quantum dots formed on inner walls of pores of the mesoporous silica of nanocrystal; and the nanocrystal is nanocrystalline silicon. After the Si-QD structure 38 absorbs a near-infrared light beam having a wavelength ranged from 1200 nanometers (nm) to 1900 nm, a optoelectronic response is generated.

In the present disclosure, wavelength between 1300 and 1550 nm is not absorbed by silicon; instead, it is absorbed by quantum dots of mesoporous silica compound material, i.e. the Si-QD structure 38. External infrared light beam acts like an additional gate voltage to rectify the drain 35 terminal. Thus, on being shone by a light, a threshold voltage is changed and a photoelectric current is enlarged to be outputted at the drain 35 terminal. Thus, a Si-QD MOSFET near-infrared photodetector fabricated according to the present disclosure shows an excellent photoelectric response at near-infrared band and a near-infrared photodetector made of pure silicon is provided.

Figure 5A:
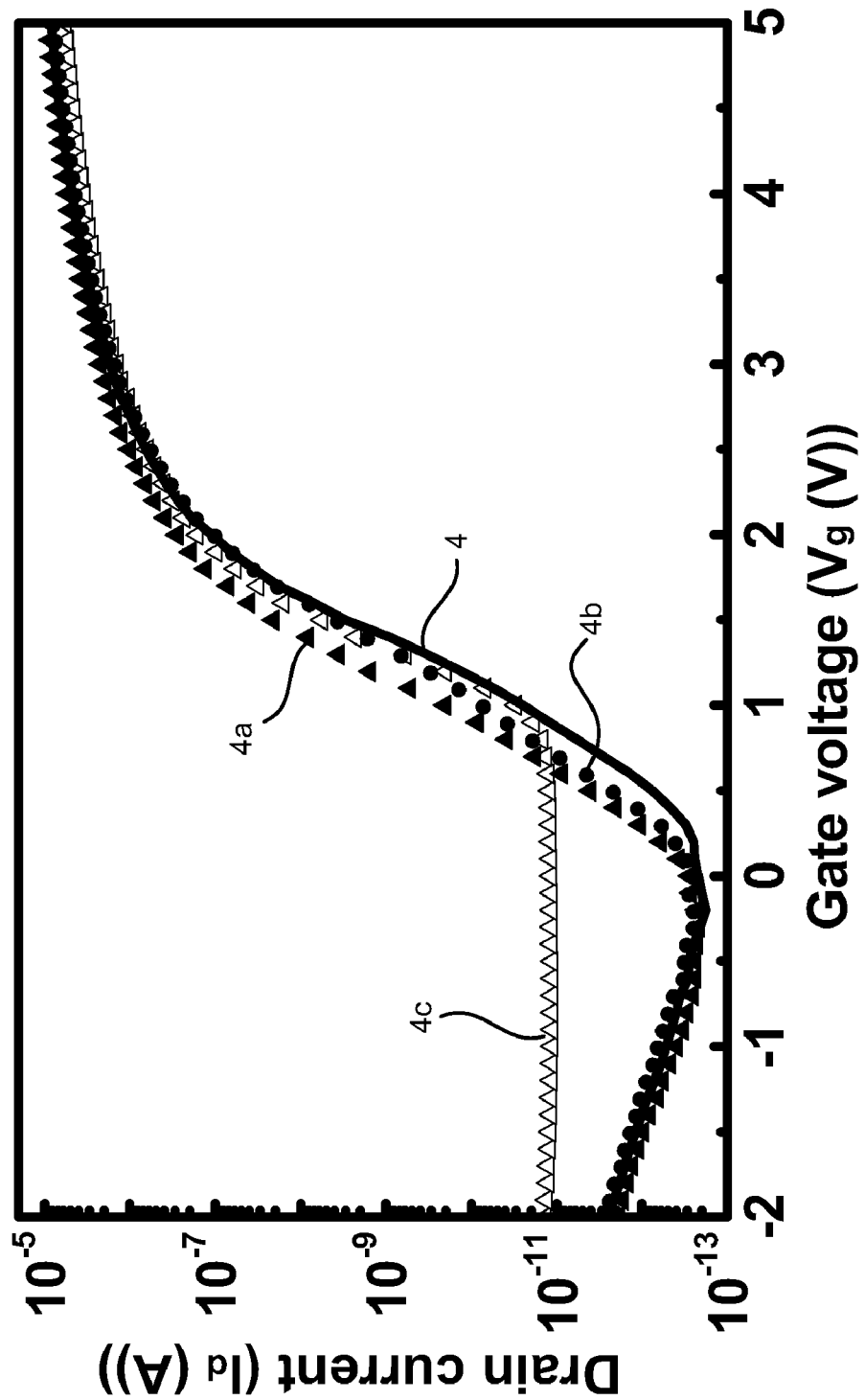
FIG. 5A and FIG. 5B are the views showing the comparisons of the $I_d$-$V_g$ curves for various wavelengths and energies.
Figure 5B:
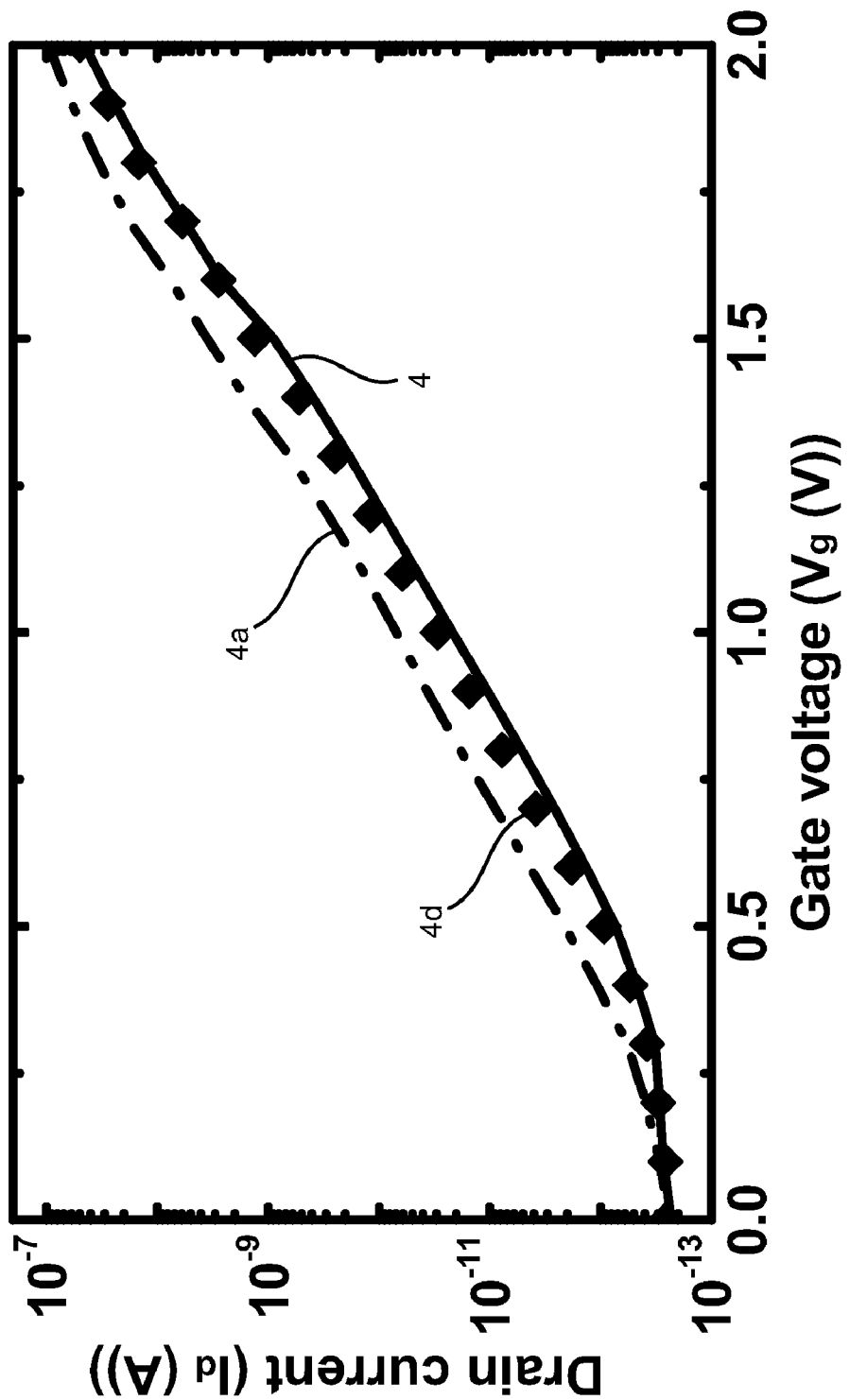
Figure 6A:
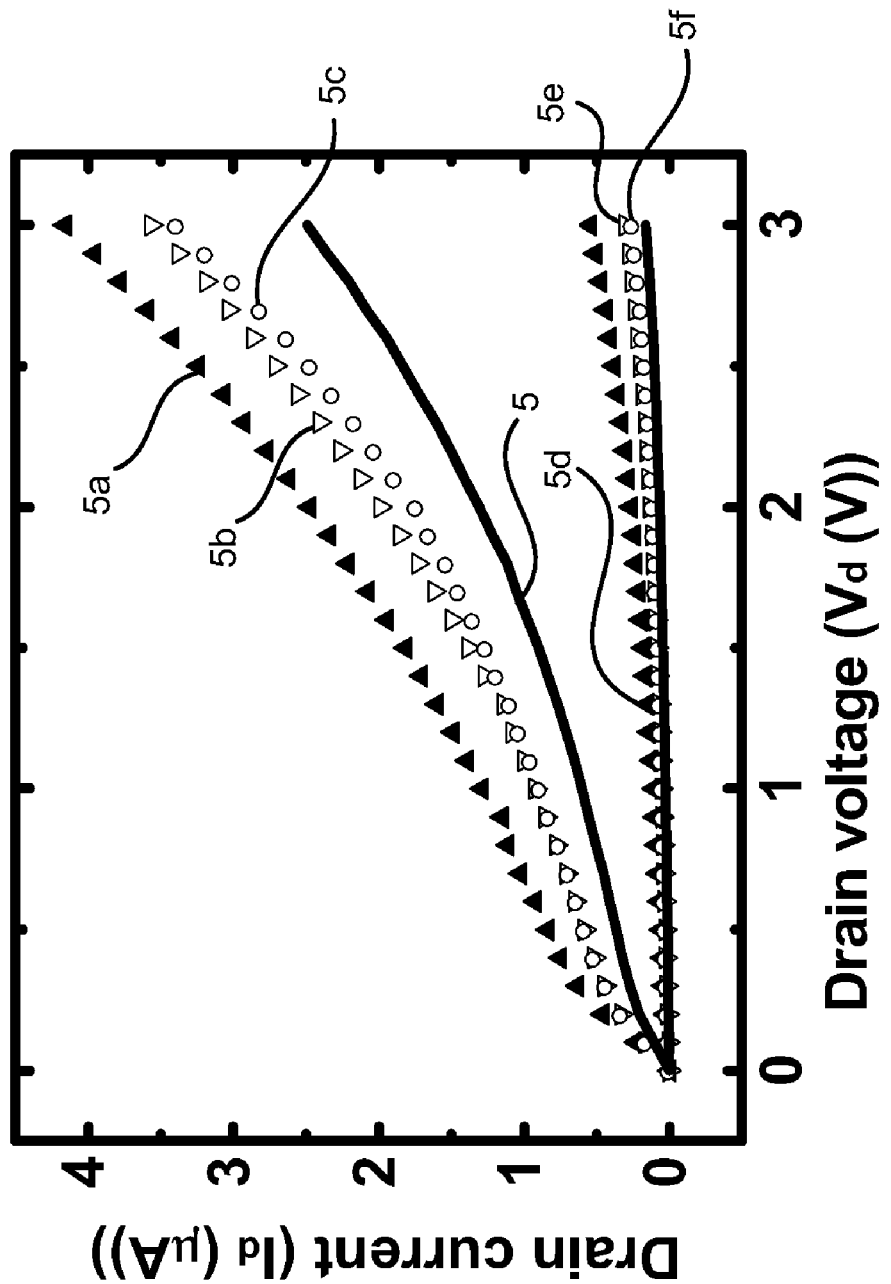
FIG. 6A and FIG. 6B are the views showing the comparisons of the $I_d$-$V_d$ curve and photoresponse for various light beams.
Figure 6B:
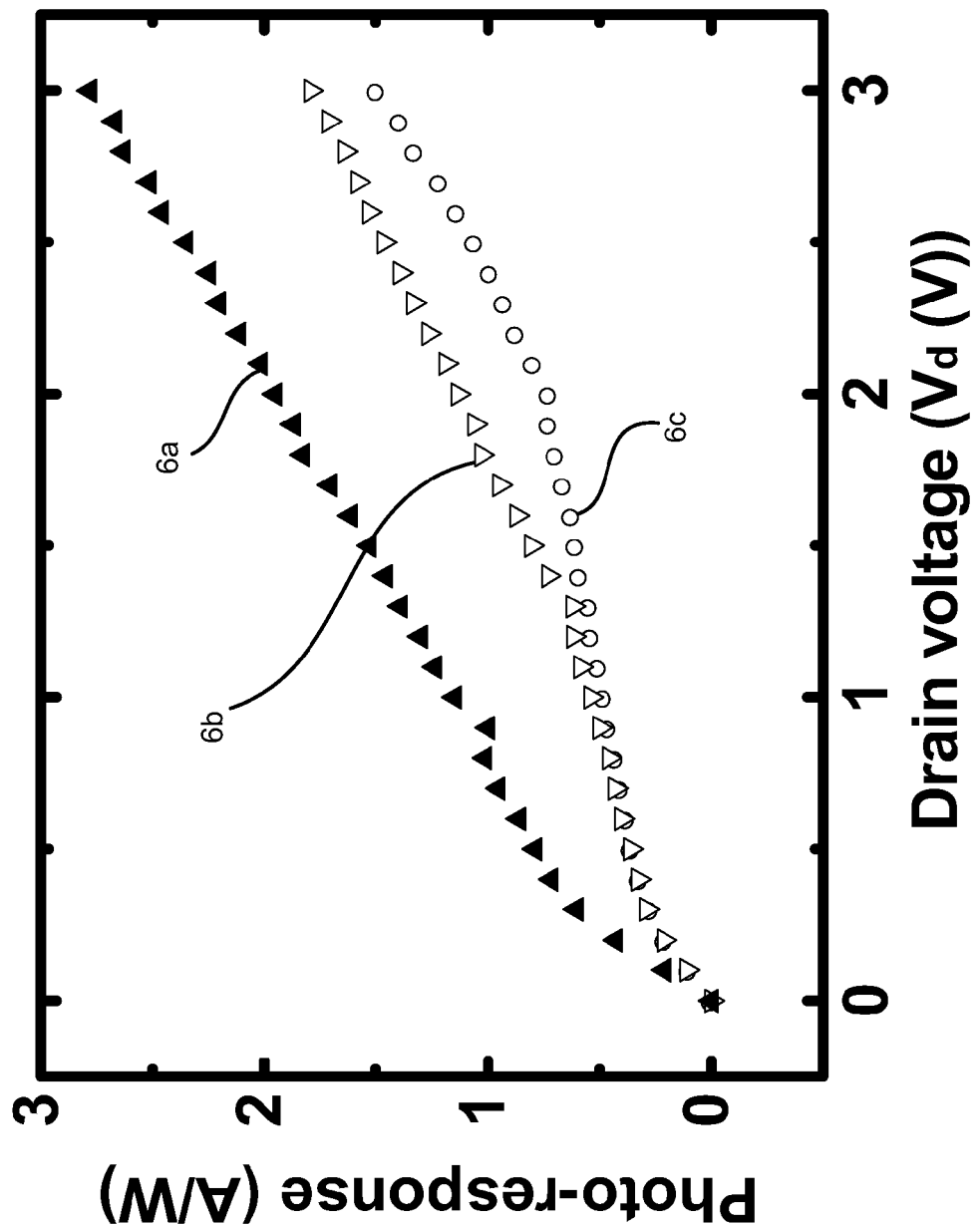

Please refer to FIG. 5A until FIG. 6B, which are views showing comparisons of $I_d$-$V_g$ curves for various wavelengths and energies; and views showing comparisons of $I_d$-$V_d$ curve and photoresponse for various light beams. As shown in the figures, a silicon-quantum-dot MOSFET near-infrared photodetector is illuminated under 1550, 1310 and 532 nm light beams for obtaining $I_d$-$V_g$ characteristic and $I_d$-$V_d$ relationship. In FIG. 5A, a dark current curve 4 not illuminated with light is referenced. Under a drain voltage ($V_d$) of 0.1 volt (V), after being illuminated by light with the above wavelengths and a power of 4 nanowatt per micrometer square (nW/μm²), photocurrent curves 4a, 4b, 4c are obtained. In FIG. 5B, the photocurrent curve 4a obtained through being illuminated by the 4 nW/μm² 1550 nm light beam is compared to a photoresponse current curve 4d obtained through being illuminated by a 2 nW/μm² 1550 nm light beam. In FIG. 6A, a dark current curve 5 not illuminated with light beam is referenced. After being illuminated by the light beams with the above wavelengths and power, photocurrent curves 5a, 5b, 5c for 1.6V gate voltage ($V_g$) and photocurrent curves 5d, 5e, 5f for 1.2V $V_g$ are obtained, respectively. In FIG. 6B, when the above wavelengths are operated under 1.6V $V_g$, 3.0V $V_d$ and 4 nW/μm² light beams, photoresponse curves 6a, 6b, 6c are obtained.

When 4 nW/μm² 1310 nm and 1550 nm light beams illuminate on a nano-structural silicon-base membrane according to the present disclosure, electron-hole pairs are formed in the membrane. Positive charge is captured in a silicon-oxygen interface state and so a gate voltage is increased to enhance a silicon-base inversion layer for enlarging photoresponse and photo-excited current. In this way, a 2.8 A/W photoresponse is reached with a wavelength between 1310 and 1550 nm. Thus, the present disclosure shows an excellent photoresponse at near-infrared band. Since intra-band absorption of Si-QD happens within the near-infrared band, the present disclosure is fit for a near-infrared photodetector.

Figure 7:
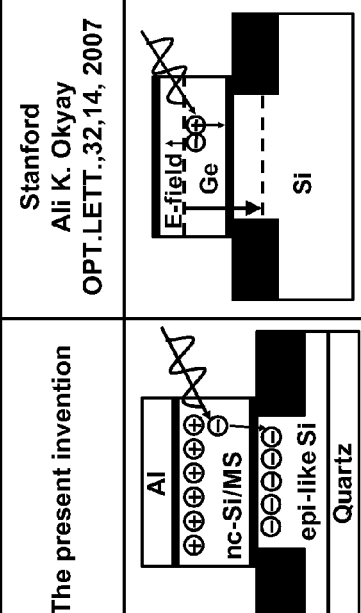
FIG. 7 is the view showing the comparison of different photodetectors.

Please refer to FIG. 7, which is a view showing a comparison of different photodetectors. As shown in the figure, the present disclosure is a MOSFET near-infrared photodetector of Si-QD SL or nc-Si/MS fabricated through pulsed high-density PAALD, which has an excellent photoresponse at near-infrared band and enlarges photocurrent simultaneously. The present disclosure is a silicon-base near-infrared photodetector having Si-QD with low cost and saved resource. On fabricating the present disclosure, a spin-coating technology and pulsed high-density PAALD compatible with techniques for very Large Scale Integrated Circuit (VLSI) are used for fast and low temperature processes. Silicon-base material is fully integrated in the present disclosure, which is very helpful for optical storage, optical communication and photovoltaic devices.

To sum up, the present disclosure is a Si-QD semiconductor near-infrared photodetector, where a semiconductor near-infrared photodetector of Si-QD SL having quantum dots of three-dimensional pure nano-silicon is fabricated through pulsed high-density PAALD with low cost and fast process; and the present disclosure has an excellent photoresponse at near-infrared band and is very helpful for optical storage, optical communication and photovoltaic devices.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present disclosure.

What is claimed is:

1. A silicon-quantum-dot (Si-QD) semiconductor near-infrared photodetector, comprising:
   a substrate;
   an epi-like silicon layer, said epi-like silicon layer being deposed on said substrate, said epi-like silicon layer respectively having a source on a part of area of said epi-like silicon layer and a drain on another part of area of said epi-like silicon layer; and
   a gate dielectric, said gate dielectric being deposed on said epi-like silicon layer, said gate dielectric comprising two buffer layers and a Si-QD structure, said Si-QD structure being clipped between said two buffer layers, said gate dielectric having a gate deposed on said gate dielectric,
   wherein said Si-QD structure is selected from a group consisting of a Si-QD superlattice (SL) and a silicon nanocrystal/mesoporous silica (nc-Si/MS);
   wherein said Si-QD structure is formed by mesoporous silica and arrays of high-density quantum dots;
   wherein said quantum dots are made of a nanocrystal and are obtained on inner walls of said pores of said mesoporous silica;
   wherein said nanocrystal is nanocrystalline silicon;
   wherein said mesoporous silica has adjustable pores and is obtained to form a template with said gate dielectric of a nano-structural silicon-base membrane as infrared light absorber to form a three-terminal nano-structural silicon-oxide gate transistor; and
   wherein, after said Si-QD structure absorbs a light beam having a wavelength ranged from 320 nanometers (nm) to 1900 nm, a optoelectronic response is obtained.

2. The photodetector according to claim 1,
   wherein said substrate is made of quartz.

3. The photodetector according to claim 1,
   wherein said nanocrystal has a density of $2.5 \times 10^{18}/cm^3$.

4. The photodetector according to claim 1,
   wherein said quantum dots are obtained by depositing nanocrystalline silicon three-dimensionally.

5. The photodetector according to claim 1,
   wherein said quantum dot has a diameter between 4 nm and 5 nm.

6. The photodetector according to claim 1,
   wherein said arrays of quantum dots are obtained through pulsed high-density Plasma Assistant Atomic Layer Chemical Vapor Deposition (PAALD).

7. The photodetector according to claim 1,
   wherein said gate is made of polycrystalline silicon.

* * * * *